(12) United States Patent
Minvielle et al.

(10) Patent No.: US 6,562,639 B1
(45) Date of Patent: May 13, 2003

(54) UTILIZING ELECTRICAL PERFORMANCE DATA TO PREDICT CD VARIATIONS ACROSS STEPPER FIELD

(75) Inventors: Anna Minvielle, San Jose, CA (US); Luigi Capodieci, Santa Cruz, CA (US); Christopher Spence, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/993,166

(22) Filed: Nov. 6, 2001

Related U.S. Application Data
(60) Provisional application No. 60/246,128, filed on Nov. 6, 2000.

(51) Int. Cl.[7] .............................................. H01L 21/66
(52) U.S. Cl. ....................................................... 438/14
(58) Field of Search ................... 438/15, 14; 355/30; 250/492.2

(56) References Cited

U.S. PATENT DOCUMENTS 5,835,227 A    11/1998   Grodnensky et al.
6,255,125 B1 * 7/2001   Schmidt ........................ 438/14
6,417,912 B1 * 7/2002   Bushman ....................... 355/30

* cited by examiner

*Primary Examiner*—John F. Niebling
*Assistant Examiner*—Andre C Stevenson
(74) *Attorney, Agent, or Firm*—Renner, Otto, Boisselle & Sklar, LLP

(57) ABSTRACT

In order to determine an amount of critical dimension variation to expect across a surface of a final production wafer, a plurality of test structures are formed on a test wafer. The test structures are preferably of a type commonly found on the final production wafer and may for example, include transistors, ring oscillators, resistors and/or diodes. Electrical parameter testing of the test structures is next conducted in order to obtain one or more electrical performance values for each test structure. For example, the electrical performance values may correspond to processing speed, drive current, and/or off-state current of the test structures. A correlation between the electrical performance values and expected critical dimension variations is then performed and a report is generated providing the expected critical dimension variations across the surface of the wafer. Expected critical dimension variations may be accounted for by varying characteristics of devices used during a photo-lithographic transfer process to the final production wafers.

27 Claims, 11 Drawing Sheets

250

| TEST STRUCTURE | MEASURED | △ PV |
|---|---|---|
| DIE 1 STRUCTURE 1 | | |
| DIE 1 STRUCTURE 2 | | |
| DIE 1 STRUCTURE 3 | | |
| | | |
| | | |
| ⋮ | | |
| DIE N STRUCTURE M | | |

UTILIZING ELECTRICAL PERFORMANCE DATA TO PREDICT CD VARIATIONS ACROSS STEPPER FIELD

Priority is claimed under 35 U.S.C. 119(e) from U.S. provisional patent application Ser. No. 60/246,128, filed Nov. 6, 2000.

TECHNICAL FIELD

The present invention generally relates to the lithographic patterning of a semiconductor wafer. In particular, the present invention relates to a method and apparatus for conducting electrical performance testing of structures formed on the semiconductor wafer, and utilizing the results of the testing to efficiently predict critical dimension variations at various locations across a stepper field.

BACKGROUND OF THE INVENTION

Errors may be introduced through various components and at various times in the manufacturing cycle of a wafer that contains several integrated circuits on respective circuit die. See the background below for further description of an exemplary manufacturing cycle. For example, during transfer of a pattern from the mask to the wafer, lens aberrations are known to cause distortions in structures formed from different areas of the same lens. Additionally, errors may be introduced during various developing and etching steps and/or through various other processes and components used during the manufacture a final production wafer.

In order to measure critical dimensions (CDs) of structures formed on a wafer so as to determine whether errors have occurred, it is known to use an electrical line width measurement technique. Electrical line width measurement involves measuring the resistivity of structures formed on a wafer using a probe and calculating CD's of the structures based on the measured resistivity.

One higher precision measurement tool utilized to measure CDs and determine if defects are present with respect to structures formed on a wafer is a scanning electron microscope (SEM). An SEM is used to inspect structures at high magnification (e.g. on the order of 200× to 2000×) using an electron beam in order to observe, for example, the line width or other dimension of each structure and/or to detect defects. While SEM provides higher resolution than the electrical line width measurement technique, at the sub-quarter micron level at which many wafer structures are currently being formed, SEM has also been found to have reached its resolution threshold. In addition, as the device density of wafers continues to increase, the process of utilizing SEM to analyze the large number of structures formed on each wafer is extremely time consuming given the need to accurately position and focus the SEM for each measurement.

One prior technique for testing a wafer has been to form a test structure on the wafer between adjacent integrated circuit die, e.g., in the "scribe space" where the wafer eventually will be cut to separate respective integrated circuit die. Those test structures have been tested by the various prior techniques mentioned above. The test data obtained, though, does not necessarily represent conditions, e.g., critical dimensions (CD's) of structures over parts of the wafer that are not at or near the test structure. Thus there is a need to improve the ability to represent CD's over large areas, and even over the entire surface, of a wafer.

Also, line width variations may cause proportional changes in operation or response for some devices of an integrated circuit structure on an integrated circuit die and non-proportional changes in other integrated circuit structures on the die. There is a need to improve the accuracy of data representing such variations and the utilization of data representing such variations.

Referring initially to FIG. 1a, integrated circuits are formed on semiconductor wafers 10 typically made from silicon. The wafers 10 are substantially round and typically have a diameter of approximately 15 to 20 cm. Each wafer 10 is divided up into individual circuit die 15 which contain an integrated circuit. Since a single integrated circuit die 15 is often no more than 1 cm$^2$, a great many integrated circuit die 15 can be formed on a single wafer 10. After the wafer 10 has been processed to form a number of integrated circuit die on its surface, the wafer 10 is cut along scribe lines 20 to separate the integrated circuit die for subsequent packaging and use.

Formation of each integrated circuit die on the wafer is accomplished using photo-lithography. In general, lithography refers to processes for pattern transfer between various media. The basic photo-lithography system consists of a light source, a photomask containing the pattern to be transferred to the wafer, a collection of lenses, and a means for aligning existing patterns on the wafer with patterns on the photomask.

Referring to FIG. 1b, during an intermediate stage in the manufacturing cycle, the wafer 10 is shown to include a film 25 which overlies the wafer 10 and a resist 30 disposed on the film 25. Exposing the resist 30 to light or radiation of an appropriate wavelength through the photomask causes modifications in the molecular structure of the resist polymers to allow for transfer of the pattern from the photomask to the resist 30. The modification to the molecular structure allows a resist developer to dissolve and remove the resist in exposed areas, presuming a positive resist is used. If a negative resist is used, the developer removes the resist in the unexposed areas.

Referring to FIG. 1c, once the resist 30 on the wafer has been developed, one or more etching steps take place which ultimately allow for transferring the desired pattern to the film 25 and/or wafer 10. For example, in order to etch the film 25 disposed between the resist 30 and the wafer 10, a wet or dry etchant is applied over the patterned resist 30. The etchant comes into contact with the underlying film layer by passing through openings 35 in the resist formed during the resist exposure and development steps. Thus, the etchant serves to etch away those regions of the film layer which correspond to the openings in the resist, thereby effectively transferring the pattern in the resist to the film layer as illustrated in FIG. 1d. In subsequent steps, the resist is removed and another etchant may be applied over the patterned film layer to transfer the pattern to the wafer or to another layer in a similar manner.

Presently, there are a variety of known techniques for transferring a pattern to a wafer using photolithography. For instance, referring to FIG. 2, a reduction step-and-repeat system 50 (also called a reduction stepper system 50) is depicted. The reduction stepper system 50 uses refractive optics to project a mask image onto a resist layer 30. The reduction stepper system 50 includes a mirror 55, a light source 60, a filter 65, a condenser lens system 70, a mask 75, a reduction lens system 80, and the wafer 10. The mirror 55 behaves as a collecting optics system to direct as much of the light from the light source 60 (e.g. KrF laser, ArF laser, mercury-vapor lamp, etc.) to the wafer 10. The filter 65 is used to limit the light exposure wavelengths to the specified frequencies and bandwidth. The condenser system 70 focuses the radiation through the mask 75 and to the reduction lens system 80 to thereby focus a "masked" radiation exposure onto one of the circuit die 15.

Since it is complex and expensive to produce a lens capable of projecting a mask of an entire wafer, the reduction stepper system 50, projects an image only onto a portion of the wafer 10 corresponding to one or more individual circuit die 15. This image is then stepped and repeated across the wafer 10 in order to transfer the pattern to the entire wafer 10 (e.g. across the entire "stepper field"). Consequently, the size of the wafer is no longer a consideration for the system optics.

Current reduction stepper systems 50 utilize masks that contain a pattern that is an enlargement of the desired image on the wafer 10. Consequently, the mask pattern is reduced when projected onto the resist 30 during exposure (and thus the name "reduction stepper").

With an ever increasing number of integrated circuit patterns being formed on a circuit die, the importance of properly designing patterns to form structures that are isolated and non-interfering with one another has also increased. Accordingly, when designing a pattern to place on a mask, it is of significant benefit to know in advance the amount of error to expect with respect to the corresponding structures formed on the wafer so that such error can be accounted for in advance. Errors are known to affect, for example, the line width, length, and position of structures or features formed on each circuit die.

Accordingly, there is a strong need in the art for a method and apparatus of efficiently and reliably determining CD variations occurring in structures formed on a wafer.

There also is a need to improve sensitivity of detecting or measuring CD variations.

There is a need, too, to make the data obtained by such detecting or measuring more relevant and useful.

SUMMARY OF THE INVENTION

Briefly, according to an aspect of the invention test structures distributed over the entire wafer field of a wafer that is used as a test wafer are used to obtain data on CD's.

According to another aspect, a test wafer is made using a method of making a usual wafer, the test wafer having test structure representing characteristics that would be included in such usual wafer, the test wafer being for testing and testing being carried out to check CD's, and the data representative of such CD's for use in characterizing the wafer, integrated circuit die thereof, and/or the manufacturing process of making such wafer.

According to another aspect, a wafer of a size that typically provides a number of integrated circuit die has test structures distributed thereover and is used as a test wafer to obtain CD data.

According to another aspect an entire test wafer is used for device measurement to obtain information regarding stepper device and/or other wafer manufacturing accuracy and/or to obtain wafer accuracy; and the obtained data may be used in conjunction with the manufacturing of subsequent wafers.

The inventors of the present invention have found that a correlation can be identified between the electrical performance of device structures formed on a wafer and CD variations occurring among the device structures formed across a stepper field. For example, it has been observed that variations in CD can be predicted by observing and comparing the processing speed of two or more of the same device structures formed at different positions in the stepper field. Accordingly, by performing parametric testing of device structures formed at various locations in the stepper field, it is possible to quickly analyze and predict the amount of CD variations which will occur during a lithographic process. The outcome of the analysis may then be used, for example, to adjust one or more characteristics of a lens to account for predicted CD variations. It has been found that utilizing the present invention, reliable CD predictions are obtainable for structures sized below a quarter-micron line width.

In accordance with one embodiment of the present invention, a test wafer is produced to include an array of test structures formed across a stepper field. The test structures are preferably structures which are commonly found in a microprocessor or other device to be formed on a final production wafer. For example, the test structures may include transistors, ring oscillators, resistors, diodes, etc. In this manner, the test structures on the test wafer may be used to more accurately predict the actual CD variations which are likely to occur with respect to device structures used in the final production wafer.

According to one feature of the present invention, each of the test structures formed across the stepper field is the same test structure so that a comparison of the electrical performance of each of the test structures can be readily obtained and analyzed to predict CD variations. Once formed, the test structures are subjected to parametric testing using known testing procedures in the art. In one embodiment of the present invention, parametric testing includes testing the processing speed of each of the test structures. Additionally, parametric testing may include the measuring of the drive current, off-state current, and other electrical parameters of each test structure.

Once one or more desired parameters of the test structures are measured, the data collected is compared with predetermined performance data. The predetermined performance data may be known optimum performance data corresponding to the performance characteristics obtainable by a test structure which is not subjected to CD variations. Alternatively, the data collected may be used to compare performance data among the various test structures formed on the wafer itself thereby providing an indication of a relative difference in CD variation occurring at different locations.

For example, if one of the desired parameters is processing speed, then the measured processing speed of each test structure may be compared with an optimal processing speed realizable if there were no CD variations in the test structure and the test structure being of a nominal value, e.g. having transistors of the same size. Next, a change in performance variation ($\Delta pv$) is calculated and compared with values in a CD conversion chart to convert the $\Delta pv$ to a predicted CD variation. The values stored in the CD conversion chart may be predetermined from prior testing and/or though performing computer simulations using known simulation packages in the art such as S.P.I.C.E. which predicts performance variation as a function of the CD. Finally, the predicted CD variations are stored in a memory of an analysis tool, computer, or other device and a report is provided or made available to a user showing the predicted CD variations throughout the stepper field.

Once obtained, the predicted CD variations on the test wafer may be used to adjust lens characteristics, reticle patterning, or other aspects of the photolithographic transfer process to account for the predicted CD variations.

According to one aspect of the present invention, a method of estimating an amount of critical dimension (CD) variation to expect at a selected point on a semiconductor wafer following a photolithographic pattern transfer process is provided. The method includes the steps of forming a test structure at the selected point on the wafer during the photolithographic pattern transfer process, measuring at least one electrical performance value of the test structure, and estimating the amount of critical dimension variation to expect based on the measured at least one electrical performance value.

In accordance with another aspect of the present invention, a method of estimating an amount of critical dimension variation to expect across a wafer following a photolithographic pattern transfer process is provided. The method includes the steps of forming a plurality of test structures at predetermined locations on the wafer during the photolithographic pattern transfer process, measuring at least one electrical performance value of at least a portion of the plurality of test structures, and estimating the amount of critical dimension variation to expect based on the measured at least one electrical performance value of the at least a portion of the plurality of test structures.

In accordance with yet another aspect of the present invention, a system for estimating an amount of critical dimension variation to expect at various locations across a surface of a wafer following patterning of a semiconductor wafer using photolithography is provided. The system includes means for forming a plurality of test structures on the wafer, means for measuring electrical performance characteristics of at least a portion of the plurality of test structures, and means for correlating the electrical performance characteristics of the at least a portion of the plurality of test structures to critical dimension variations for each of the at least a portion of the plurality of test structures.

In accordance with still another aspect of the present invention, a device for estimating critical dimension variations across a stepper field is provided. The device including a processor, a memory coupled to the processor, a data input device coupled to the processor for receiving electrical performance characteristics of a plurality of test structures formed on a semiconductor wafer, wherein the memory includes a table for correlating the electrical performance characteristics with an estimated critical dimension variation.

To the accomplishment of the foregoing and related ends, the invention then, comprises the features hereinafter fully described and particularly pointed out in the claims. The following description and the annexed drawings set fourth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention when considered in conjunction with the drawings.

BRIEF DESCRIPTION OF THE DRAWINGS

In the annexed drawings:

FIG. 7 is diagram of a performance table used in conjunction with the present invention;

DESCRIPTION

The present invention will now be described with respect to the accompanying drawings in which like numbered elements represent like parts.

The inventors of the present invention have found that a correlation can be identified between the electrical performance of structures formed on a semiconductor wafer and the amount of variation in critical dimension (CD), performance and/or other factors occurring with respect to each of the structures. Accordingly, CD variations can be quickly and reliably predicted for different locations across a stepper field by performing parametric testing of such structures. The inventors have also found that by measuring electrical parameters, CD variations can be reliably predicted for structures of various sizes, including structures having a line width at the sub-quarter micron level. Thus, in order to allow predicted CD variations to be accounted for prior to production of final production wafers, the present invention preferably calls for CD variations to be predicted initially from a test wafer formed of an array of test structures. Variations in CD found at different locations throughout the stepper field can then be adjusted for by varying optical parameters or other parameters of devices used in manufacturing the final production wafer.

Figure 3:
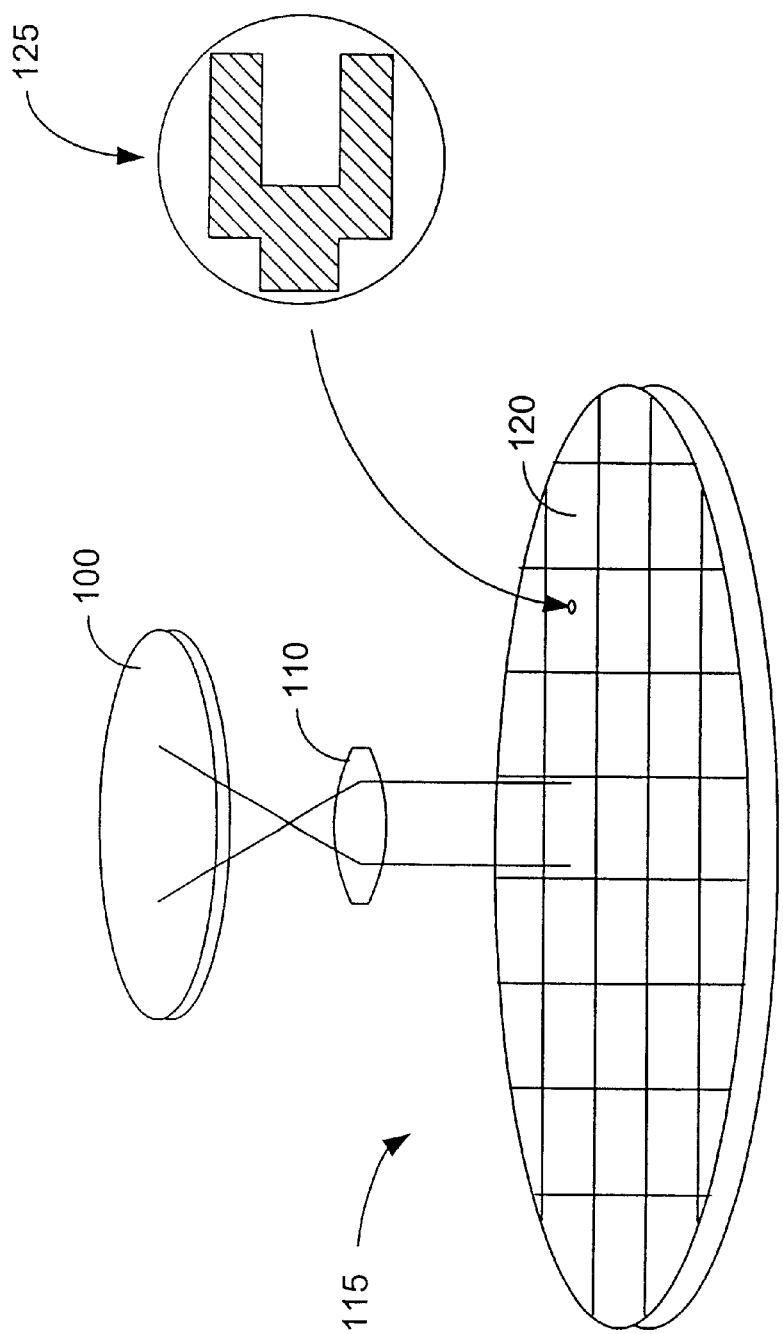
FIG. 3 is a partial system view of a reduction stepper operating in accordance with the present invention.
Figure 4:
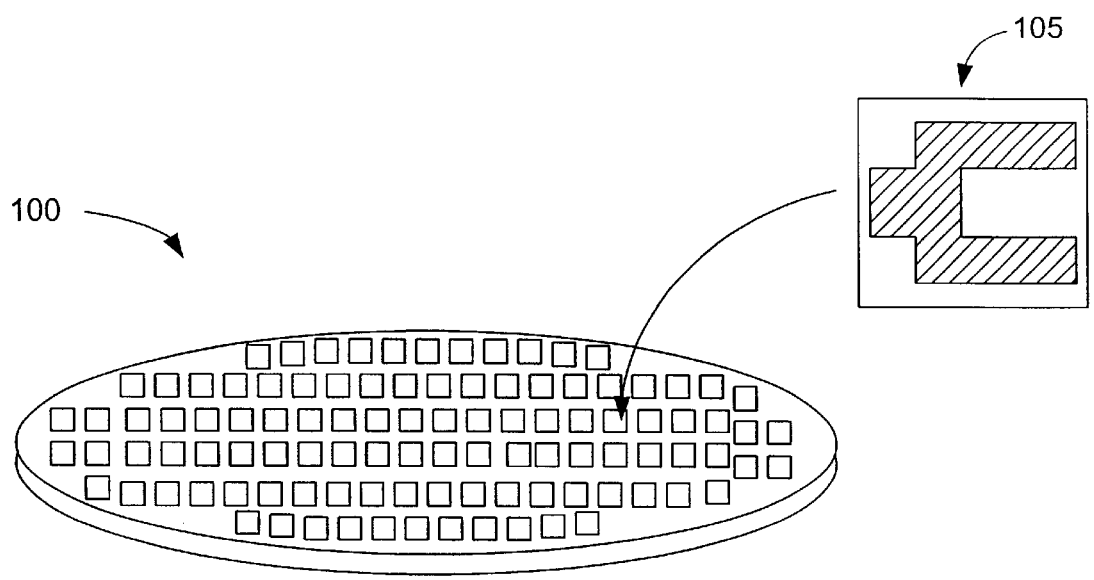
FIG. 4 is a diagrammatic view of a test reticle having an array of test patterns formed thereon in accordance with the present invention.

Referring to FIGS. 3 and 4, a test reticle 100 having an array of test patterns 105 (FIG. 4) formed thereon is shown to have the test patterns 105 transferred through a lens 110 to a test wafer 115. The test wafer 115 includes a plurality of circuit die 120 which are photolithographically patterned using the test reticle 100 in a step-and-repeat transfer process. As discussed in more detail below, test structures 125 corresponding to each of the test patterns 105 are formed on each die 120 and are subjected to electrical parameter testing to predict CD variations at various locations across a surface 130 of the test wafer 115 (e.g. across a "stepper field").

Each of the test structures 105 formed on the test wafer 115 preferably corresponds to a device structure commonly occurring on final production wafers. For example, in the present embodiment, the final production wafers include structures for forming a microprocessor. Accordingly, the test structures 105 formed on the test wafer 115 are preferably structures such as transistors, ring oscillators, resistors, diodes, etc., which are commonly used in forming a microprocessor. For example, in the present embodiment, each of the test patterns 105 and corresponding test structures 125 formed on the test wafer 115 correspond to a structure of a transistor. In this manner, CD variation data obtained from the test wafer 115 can be used to reliably predict actual CD variations expected to occur on the final production wafers.

Figure 1A:
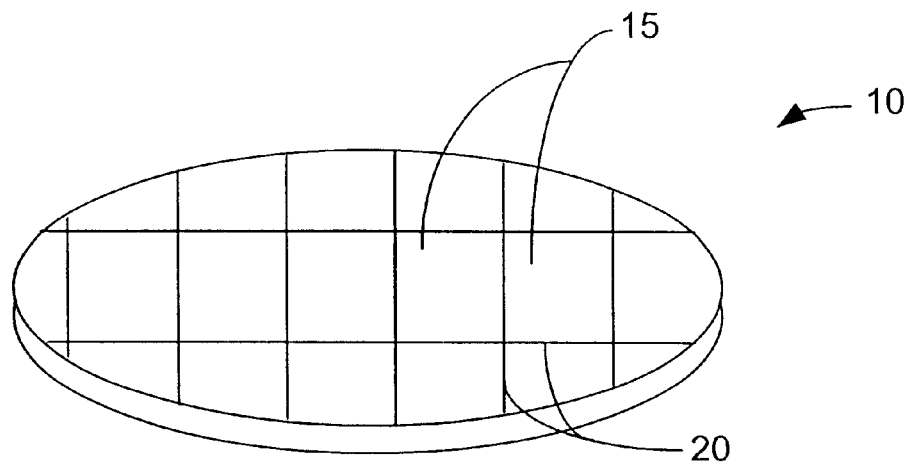
FIG. 1a is a diagrammatic view of a prior art semiconductor wafer having a circuit die formed thereon.
Figure 1B:
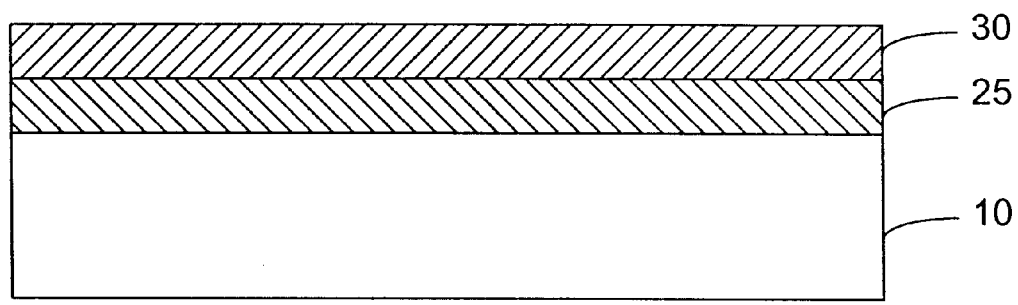
FIG. 1b is a partial cross section illustrating a prior art semiconductor wafer having a film overlying the wafer which in turn is covered by a resist layer.
Figure 1C:
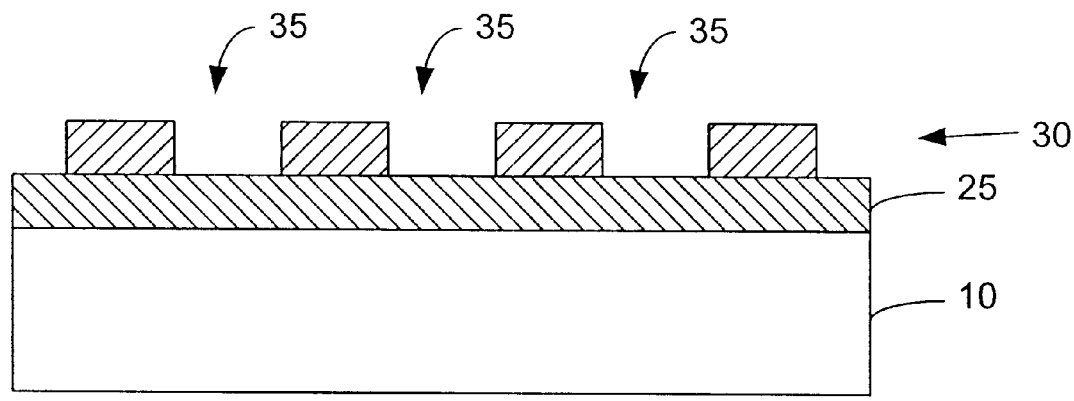
FIG. 1c is a partial cross section illustrating the resist layer of FIG. 1b after being developed.
Figure 1D:
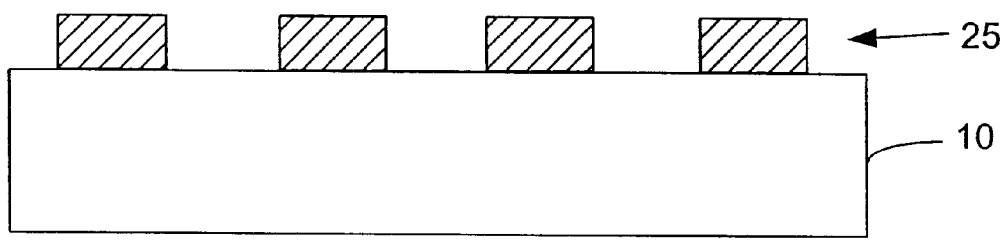
FIG. 1d is a partial cross section illustrating the film layer of FIG. 1c after being etched.
Figure 2:
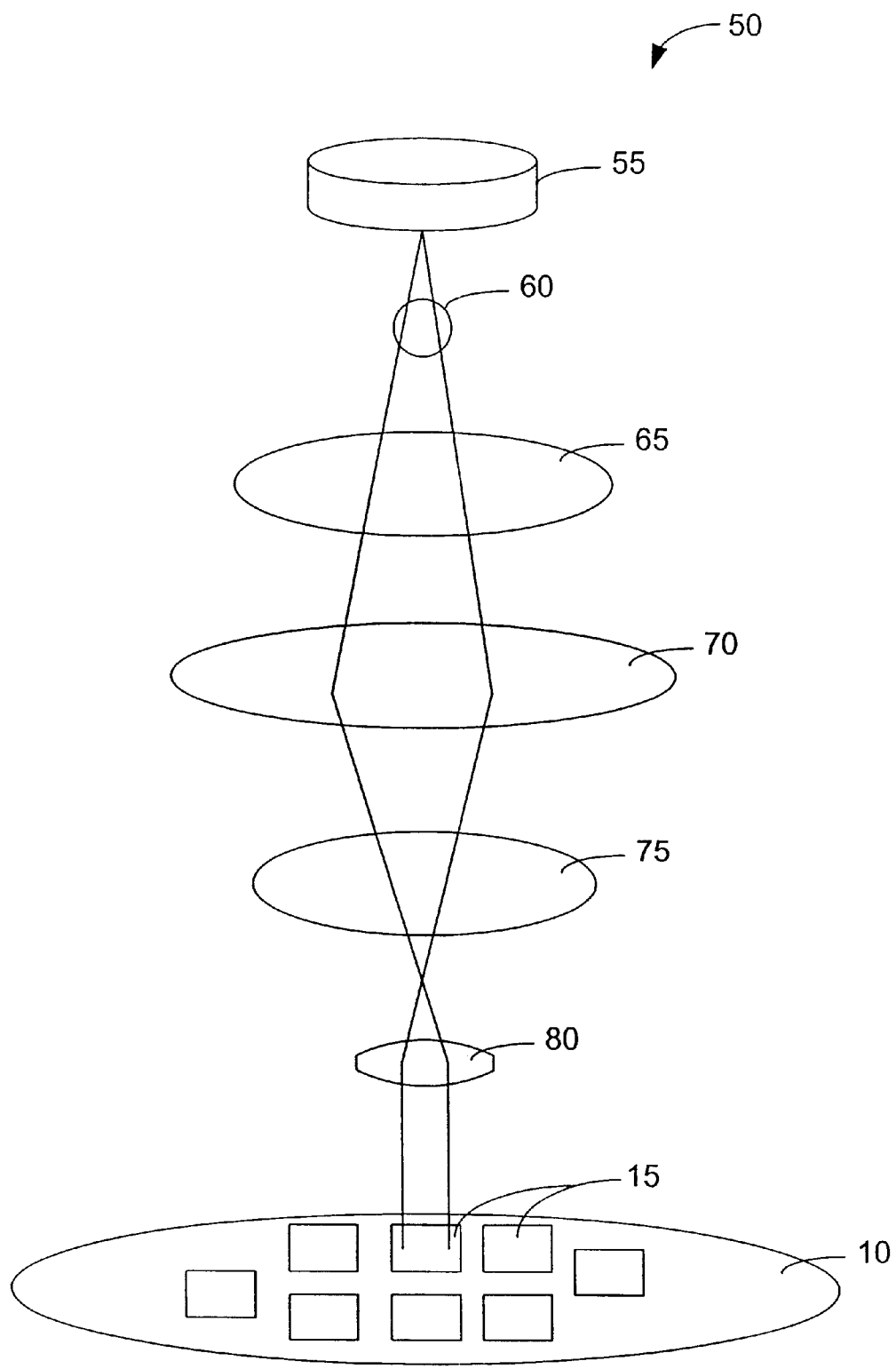
FIG. 2 is a system view of a prior art reduction stepper wherein refractive optics are used to transfer a pattern to a circuit die on a wafer.
Figure 5:
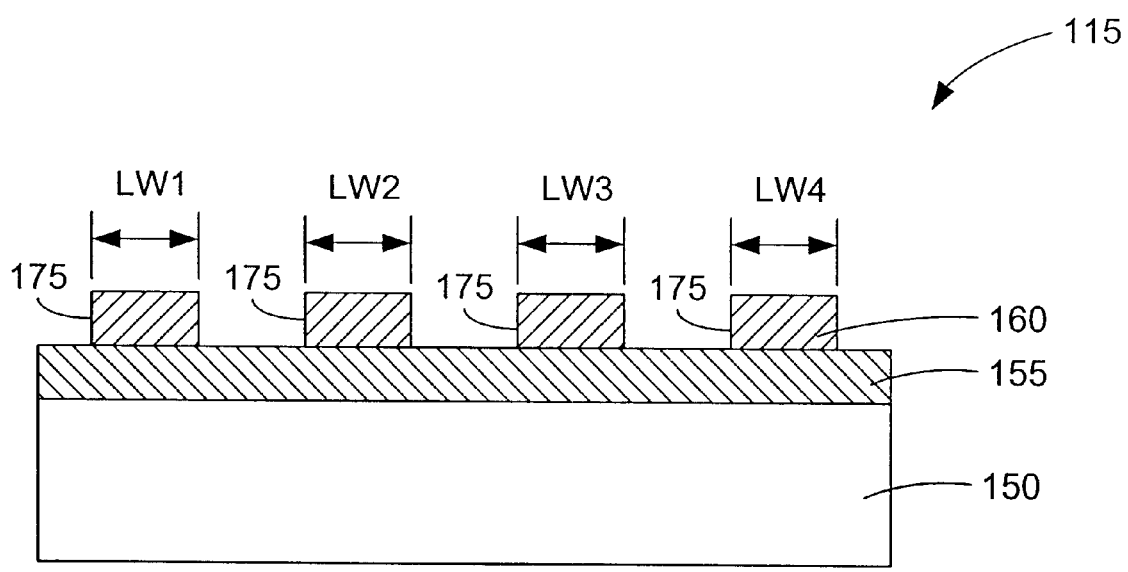
FIG. 5 is a partial cross-sectional view of a test wafer having test structures formed thereon in accordance with the present invention.

Referring now to FIG. 5, a representative cross-section of the test wafer 115 is shown following a photolithographic transfer of the test pattern 105 thereto. The process of photolithographically transferring the test pattern 105 from the test reticle 100 to the test wafer 115 is in accordance with known techniques in the art such as that described above with respect to FIGS. 1b–1d. Accordingly, additional details related to the photolithographic transfer process are not described for sake of brevity.

The test wafer 115 is shown to include a substrate 150, an oxide layer 155 overlying the substrate 150, and an etched film layer 160 formed over the oxide layer 155. The film layer 160 serves to photolithographically receive the test patterns 105 transferred from the test reticle 100 in order to form the test structures 125 for electrical testing and analysis. In the present embodiment, the film layer 160 is composed of poly-silicon however it will be appreciated that other suitable materials could alternatively be used. As shown in FIG. 5, the test structures 125 formed in the film layer 160 each include features 175 having corresponding line widths LW1, LW2, LW3, LW4. As known, the line width LW1, LW2, LW3, LW4 of each of the features 175 may deviate from a desired line width due to one of many factors. For example, the actual line widths LW1, LW2, LW3, LW4 may deviate from the desired line width due to lens aberrations, mis-alignment of the stepper machine, non-uniform developing and etching of various layers, and other known sources of error.

In order to determine the amount of error, the present embodiment provides for conducting parametric testing of each test structure to obtain electrical performance criteria or values. In one embodiment, the obtained electrical performance criteria is compared with predetermined performance data to calculate a performance variation ($\Delta$pv). Alternatively, the performance criteria of one or more structures may be compared with the performance criteria of other similar structures formed at various locations on the wafer to obtain a comparison result from which relative CD variations across the stepper field can be determined.

In the embodiment utilizing a comparison between a performance criteria and predetermined performance data, the predetermined performance data may be based on known optimum performance data. The known optimum performance data is, for example, the expected performance if there were no CD variations in the structures formed on the test wafer. Once determined, the $\Delta$pv is correlated with a predetermined predicted amount of CD variation for that level of change thereby providing a user with data predictive of expected CD variations across the stepper field.

Figure 6:
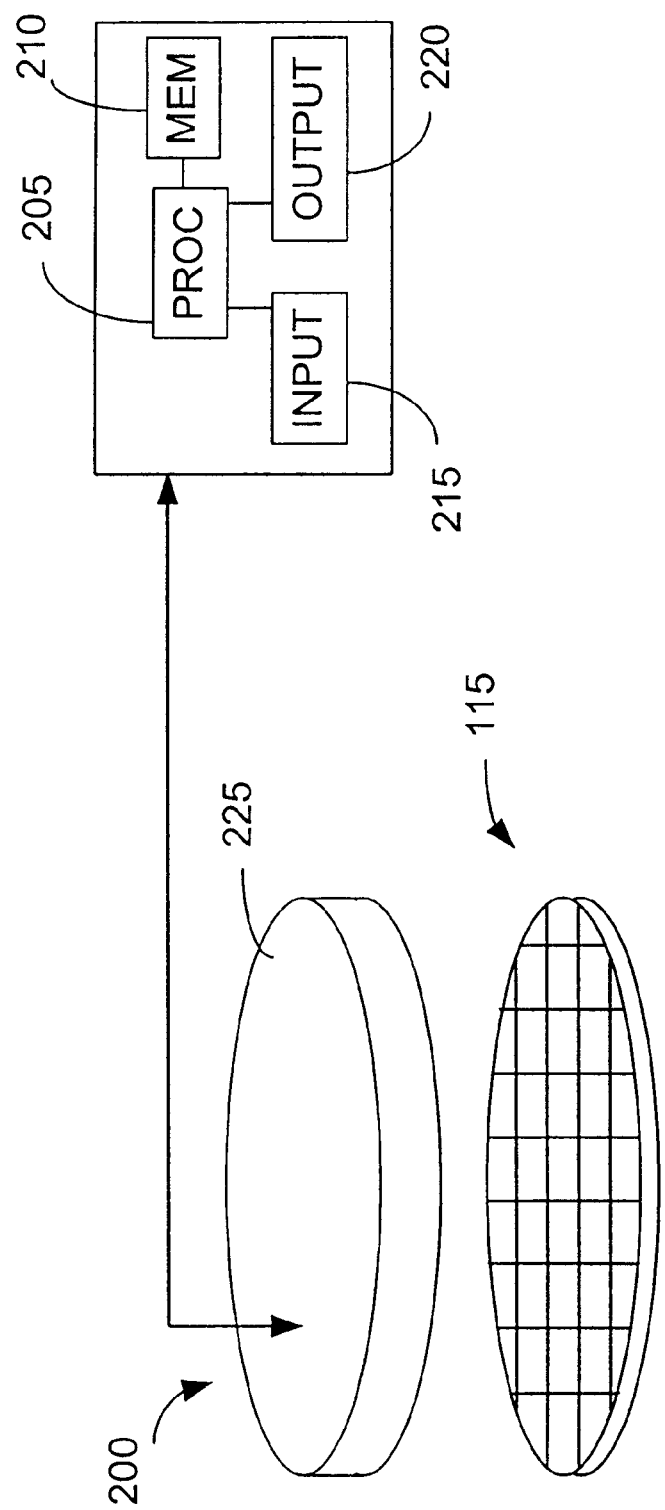
FIG. 6 is a diagrammatic view of an analysis tool obtaining electrical performance data from test structures formed on the test wafer in accordance with the present invention.

Accordingly, as shown in FIG. 6, an analysis tool 200 for testing the electrical performance of the test structures 125 is depicted. The analysis tool 200 may be any one a variety of known tools for measuring the electrical performance s of structure formed on a wafer. In the present embodiment, the analysis tool may be a test station or prober tool, such as tools commercially available from Hewlett Packard, Palo Alto, Calif. or Keithly Instruments, Inc., Cleveland, Ohio.

As shown in FIG. 6, the analysis tool 200 includes a processor 205 for performing the operations described herein. Coupled to the processor 205 is a memory 210, a user input device 215, a user output device 220, and a reader 225. The user input device may, for example, be a keypad for entry of data. The user output device 220 may, for example, be a combination of a display screen and a printer for providing both soft and hard copies of output data. The reader 225 serves to directly interface with the structures formed on the test wafer 115 to take electrical measurements thereof.

The reader 225 of the analysis tool 200 is configured to measure a predefined set of electrical parameters. For example, the predefined set of electrical parameters may correspond to one or more of the following: processing speed, drive current, off-state current, switching time, threshold voltage, or ring oscillator staged delay. In the present embodiment, the analysis tool 200 is configured to measure the processing speed of each test structure 125. As will be discussed in more detail below, the measured processing speed of each test structure 125 will then be compared with a nominal or designed processing speed to determine CD variations at that location in the stepper field. It will be appreciated that the manner in which to preconfigure the analysis tool 200 to take processing speed and other electrical measurements is well known in the art and therefore additional discussion related thereto is omitted for sake of brevity.

Referring now to FIG. 7, an electrical performance table 250 is depicted. The performance table 250 serves to maintain a list of electrical performance information for each test structure 125 in the stepper field. As shown in FIG. 7, the performance table 250 of the present embodiment includes a test structure column 252, a measured electrical performance column 254, and a performance variation $\Delta$pv column 256. The test structure column 252 includes indicia indicative of a die number and test structure number for each test structure 125 on the test wafer 115. The die number and test structure number correspond to preassigned die and test structure numbers used to individually identify each. The measured electrical performance column 254 includes indicies representative of the measured electrical parameter of the corresponding test structure 125 as measured by the analysis tool 200. For example, in the present embodiment, the measured electrical parameter is the processing speed of each test structure. Thus, the electrical performance column 254 maintains the measured processing speed of each of the test structures across the stepper field.

Figures 8A, 8B:
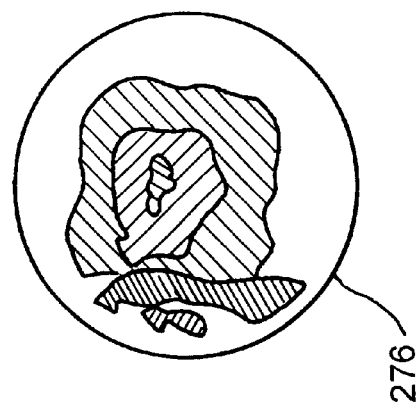
FIG. 8a is a diagram of a CD conversion chart used in conjunction with the present invention.
FIG. 8b is a schematic contour plot.

In the present embodiment, the performance variation $\Delta$pv field 256 has stored therein a difference between the measurement taken of a given electrical parameter and an optimal known value for that measurement and one can obtain a spatial relationship greater, more, or better than $\Delta$CD (see below), as is shown in FIG. 8a at 275 and in graphical form at 276 in FIGS. 8b and in FIG. 9b. The optimal known value corresponds to the value expected if no CD variations were present in the test structure. For example, in the present embodiment, the measured processing speed of each test structure is subtracted from a pre-stored known optimal processing speed for such test structures formed with no CD variation (e.g. $\Delta$pv=optimal processing speed—measured processing speed). In the present embodiment, the optimal processing speed is determined in advance through testing or simulation as is known in the art. The optimal processing speed is then pre-stored in the memory 210 of the analysis tool 200. Of course, the optimal processing speed need not be pre-stored in memory 210 or predetermined, but instead could be entered at some later time through the user input device 215 of the analysis tool 200 and/or calculated from a test structure 125 known not to include CD variations.

It will be appreciated, that while the present embodiment depicts the a comparison made between a measured electrical performance and a known optimal value, it is possible to estimate relative CD variations without the use of a known optimal value for each structure. For example, by comparing the electrical performance of similar structures formed at different locations in the stepper field, a relative change in performance value can be stored in the $\Delta pv$ field 256 which represents the change in performance value between a selected structure and all other structures. Based on such relative performance variations, a corresponding relative change in CD variations among such structures can also be determined.

Turning now to FIG. 8a, a CD conversion chart 275 is depicted. The CD conversion chart 275 is pre-stored into the memory 210 of the analysis tool 200 and provides a correlation between the performance variation $\Delta pv$ and a predicted change in CD ($\Delta CD$). The values for the predicted change in CD for each performance variation is preferably determined in advance through testing and/or computer simulation. It is possible that the CD measurements may show less noise than the other parameters. For example, in order to obtain such information, test structures having different degrees of CD variation may be formed and tested to determine performance variations for each different size test structure. The data collected from such testing is then stored in the appropriate row in the CD conversion table 275. In order to provide reliable data, the test structures used to provide data for the CD conversion table 275 are preferably formed of the same material and are formed in the same pattern as the test structures formed on the test reticle 100. A contour plot 276 representative of a test structure is represented schematically in FIG. 8b.

Figure 9A:
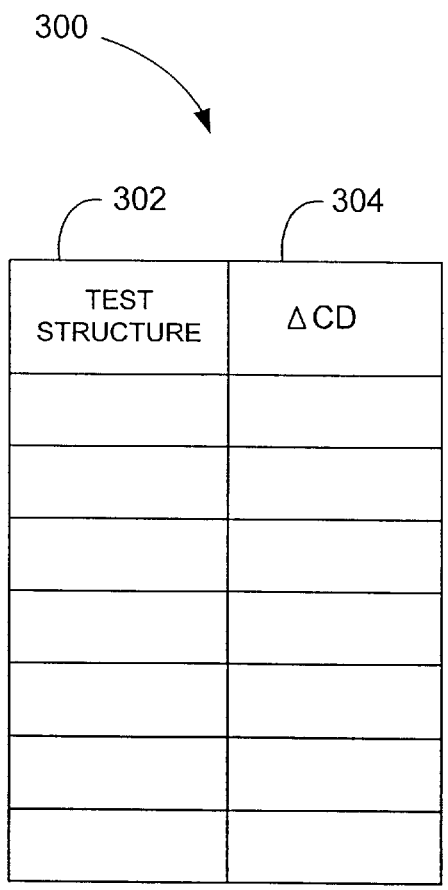
FIGS. 9a and 9b are illustrations of CD reports produced in accordance with the present invention.
Figure 9B:
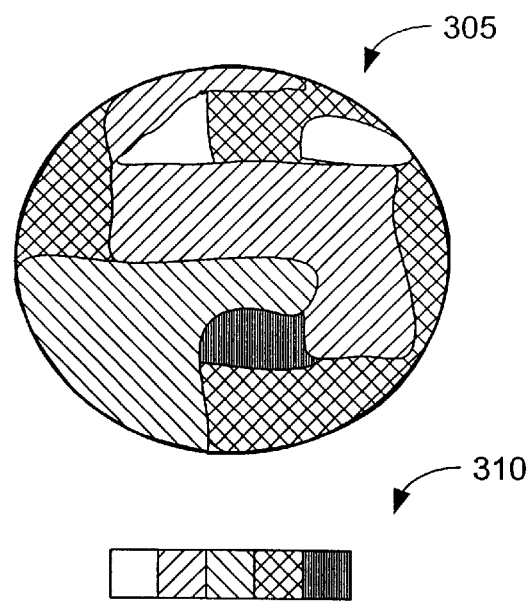

Referring now to FIG. 9a and 9b, CD reports 300, 305 providing an analysis of the predicted CD variations across the stepper field are shown. CD report 300 (FIG. 9a) is shown to provide the results in a table format while CD report 305 (FIG. 9b) provides the results in a graphical format of a contour plot. More particularly, CD report 300 includes a test structure column 302 and a CD variation column 304 ($\Delta CD$). The test structure column 302 includes indicia indicative of a die number and test structure number for each test structure 125 on the test wafer 115. The CD variation column 304 provides the $\Delta CD$ determined from the CD conversion table 275 for each entry in the performance table 250 (FIG. 7). In this manner, the expected CD variations for each point in the stepper field having a test structure 125 can be determined.

The graphical CD report 305 provides a graphical overview of CD variations occurring throughout the stepper field. For example, in the present embodiment, the graphical CD report 305 includes an outlined representation of the test wafer 115 overlaid with patterns indicative of the amount of CD variations occurring at various location in the stepper field. For example, areas having a fully white overlay may correspond to regions having no CD variation while areas having other patterns or shades may correspond to various other levels CD variation. A scale 310 for the graphical CD report is also provided and is preferably scaled to evenly distribute the maximum range of CD variations among the patterns or gray scale colors available. As a feature of the present embodiment, a user (through the user input device 215 of the analysis tool 200) may request that graphical CD report 305 be provided at various zoom levels so that regions of particular interest may be examined more closely. It will be appreciated that while in the present embodiment a set of patterns is used to represent a scale of CD variations, it is possible to use a color scale, or other types of identifying indicia on the graphical CD report 305, and the present invention is not limited to any particular output format.

Once a user obtains predicted CD variation for each point in the stepper field, the present invention provides for modifying the characteristics of one or more optical components used during the photolithographic process to account for the differences. For example, according to the present embodiment, the characteristics of the lens 110 (FIG. 3) may be modified to account for the variations in CD across the stepper field. Examples of such modifications are numerical aperture of the lens, illuminating conditions, partial coherence of the lens, part of the lens used, scanning systems and possibly others.

Figure 10:
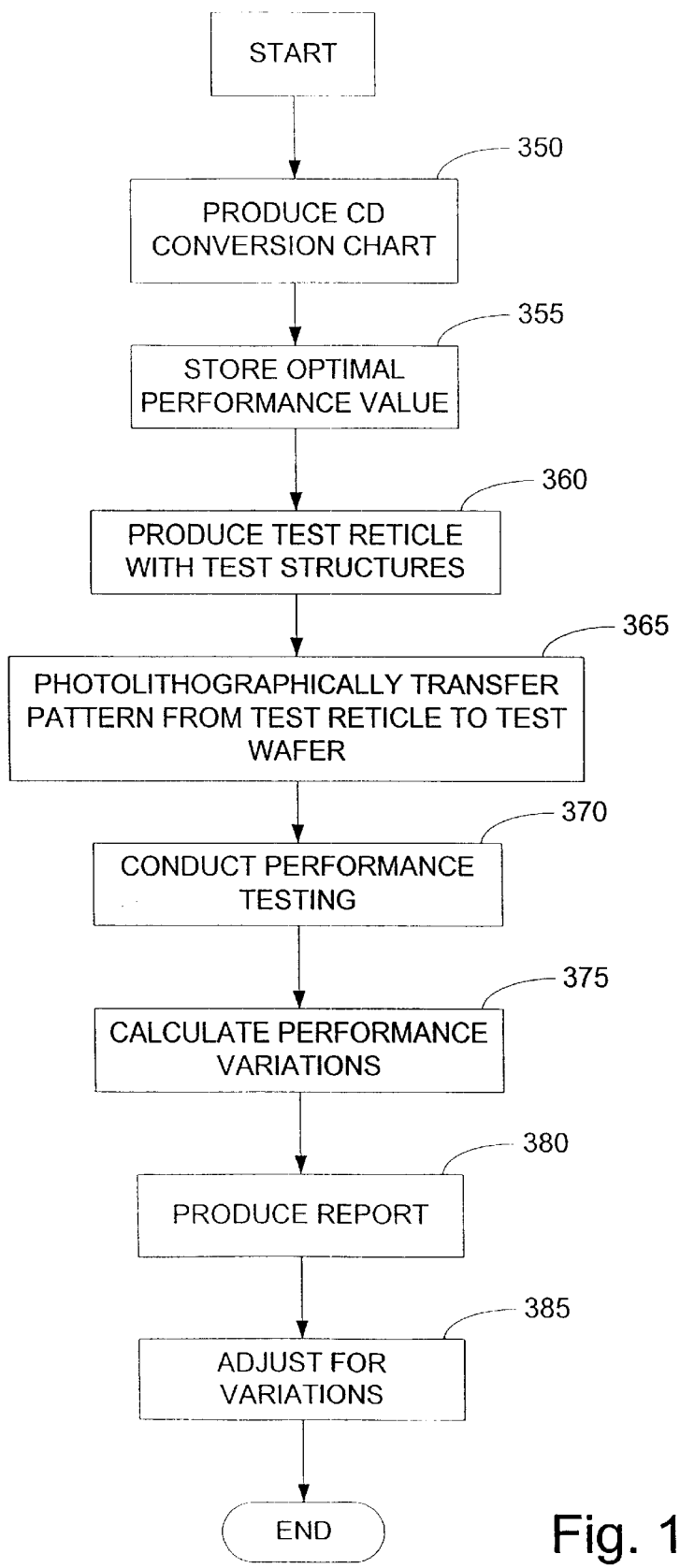
FIG. 10 is a flow chart illustrating steps involved in predicting and correcting for CD variations occurring at various points across the stepper field in accordance with the present invention.

Turning now to FIG. 10, a flow chart showing the various steps involved in predicting CD variations across a stepper field using electrical performance measurements taken from test structures is depicted. In particular, at step 350 the CD conversion chart 275 (FIG. 8a) is initially entered into the memory 210 of the analysis tool 200 to provide a pre-known correlation between performance variations and change in CD. As discussed above, data for the CD conversion chart 275 may be obtained through testing and/or through computer simulation. Next, in step 355 an optimal performance value for each type of test structure used is also stored in the memory 210 so that the performance variation $\Delta pv$ for each test structure can be determined following performance measurement.

Following storage of the optimal performance value(s), the test reticle 100 is produced to include a plurality of test patterns 105. Next, in step 365, each test pattern 105 from the test reticle 100 is photolithographically transferred to the test wafer 115 in a step-and-repeat process. After each of the test structures 125 is formed on the test wafer 115, performance testing is conducted on each of the test structures 125 using the analysis tool 200 as depicted in step 370. As discussed above, the measured performance values for each test structure 125 is stored in the performance table 250 (FIG. 7).

Following obtaining measured performance values for each test structure 125, the performance variation $\Delta pv$ for each test structure is calculated and stored in performance variation column 256 of the performance table 250 as represented by step 375. Next, in step 380, one or more CD reports 300, 305 (FIGS. 9a–9b) are generated and provided to a user for further analysis. Based on the predicted CD variations, a user may then adjust for the CD variations prior to manufacturing final production wafers by adjusting optical characteristics of the lens or other parameters of devices used during the photolithographic pattern transfer process as shown with respect to step 385. In this manner, a fast and reliable method for compensating for CD variations for structures formed with line widths even below the quarter-micron level is provided.

The invention has been described with reference to the preferred embodiments. Obviously, modifications and alterations will occur to others upon reading and understanding the preceding detailed description. For example, while the present embodiment provides for predicting CD variations based on processing speed, it will be appreciated that additional or alternative electrical parameters could have been used. In such a case the performance table 250 and CD conversion chart 275 would appropriately include columns for each electrical parameter used. One example of a particular correlation which could occur using this invention is between dense and isolated regions of transition. Changing the partial coherence of the lens changes the dense to isolated transitions differently (differential effect), vis-a-vis CD bias. In addition, changing the reticle results in the removal of known systematic horizontal or vertical bias. Further, it will be appreciated that while the present embodiment depicts a step-and-repeat system for photolithographically transferring patterns to the test wafer, other forms of transferring patterns which do not involve step-and-repeat could also be used. It is intended that the invention be construed as including all such modifications alterations, and equivalents thereof and is limited only by the scope of the following claims.

What is claimed is:

1. A method of estimating an amount of critical dimension variation to expect at a selected point on a semiconductor wafer following a photolithographic pattern transfer process, the method comprising the steps of:

forming a test structure at the selected point on the wafer during the photolithographic pattern transfer process;

measuring at least one electrical performance value of the test structure, wherein the electrical performance value is at least one of processing speed, drive current, and off-state current of the test structure; and estimating the amount of critical dimension variation to expect based on the measured at least one electrical performance value.

2. The method of claim 1, further comprising preparing a wafer of a size and configuration typically used in making plural integrated circuit die, and said forming a test structure comprising preparing test structures distributed over the entire wafer to form a test wafer.

3. The method of claim 1, wherein the test structure is at least one of a transistor, ring oscillator, resistor and diode.

4. The method of claim 1, wherein the step of estimating includes the step of correlating the measured at least one electrical performance value to a predetermined critical dimension variation.

5. The method of claim 1, wherein the step of estimating is based on a comparison between a measured electric performance value of two test structures formed on the wafer.

6. The method of claim 1, wherein the method further includes the step of adjusting an optical parameter of an optical system used during the photolithographic pattern transfer process to substantially account for the estimated critical dimension variation.

7. The method of claim 1, wherein the method further includes the step of adjusting at least one of a mask dimension and another optical parameter of an optical system used during the photolithographic pattern transfer process to substantially account for the estimated critical dimension variation.

8. The method of claim 1, wherein the estimated critical dimension variation corresponds to at least one of an estimated line width variation and an estimated line length variation.

9. A method of estimating an amount of critical dimension variation to expect across a wafer following a photolithographic pattern transfer process, the method comprising the steps of:

forming a plurality of test structures at predetermined locations on the wafer during the photolithographic pattern transfer process;

measuring at least one electrical performance value of at least a portion of the plurality of test structures, wherein the electrical performance value is at least one of processing speed, drive current, and off-state current; and estimating the amount of critical dimension variation to expect based on the measured at least one electrical performance value of the at least a portion of the plurality of test structures.

10. The method of claim 9, further comprising preparing a wafer of a size and configuration typically used in making plural integrated circuit die, and said forming a test structure comprising preparing test structures distributed over the entire wafer to form a test wafer.

11. The method of claim 9, wherein the plurality of test structures are at least one of a transistor, ring oscillator, resistor and diode.

12. The method of claim 9, wherein the plurality of test structures are substantially identical.

13. The method of claim 9, wherein the step of estimating includes the step of correlating each of the measured at least one electrical performance value to a respective predetermined critical dimension variation.

14. A method of estimating an amount of critical dimension variation to expect at a selected point on a semiconductor wafer following a photolithographic pattern transfer process, the method comprising the steps of:

forming a plurality of test structures at predetermined locations on the wafer during the photolithographic pattern transfer process;

measuring at least one electrical performance value of at least a portion of the plurality of test structures, wherein the electrical performance value is at least one of processing speed, drive current, and off-state current;

estimating the amount of critical dimension variation to expect based on the measured at least one electrical performance value of the at least a portion of the plurality of test structures; wherein the step of estimating includes the step of correlating each of the measured at least one electrical performance value to a respective predetermined critical dimension variation; and creating a report of critical dimension variations across the wafer based on the respective predetermined critical dimension variation.

15. The method of claim 14, wherein the report is in a table format.

16. The method of claim 14, wherein the report is in a graphical format.

17. A method of estimating an amount of critical dimension variation to expect at a selected point on a semiconductor water following a photolithographic pattern transfer process, the method comprising the steps of: forming a test structure at the selected point on the wafer during the photolithographic pattern transfer process, wherein the test structure is a transistor; measuring at least one electrical performance value of the test structure selected from at least one of a drive current, an off-state current and a threshold voltage; and estimating the amount of critical dimension variation to expect based on the measured at least one electrical performance value.

18. The method of claim 17, further consisting of forming a plurality of test structures at predetermined locations on the wafer during the photolithographic pattern transfer process, wherein each test structure is a transistor.

19. The method of claim 18, wherein the step of estimating is based on a comparison between a measured electric performance value of the plurality of test structures formed on the wafer.

20. The method of claim 19, further comprising the step of, creating a report of critical dimension variations across the wafer based on the respective predetermined critical dimension variation.

21. The method of claim 17, wherein the electrical performance value of the test structure is drive current.

22. The method of claim 17, wherein the electrical performance value of the test structure is off-state current.

23. The method of claim 17, wherein the electrical performance value of the test structure is threshold voltage.

24. The method of claim 17, wherein the step of estimating includes the step of correlating the measured at least one electrical performance value to a predetermined critical dimension variation.

25. The method of claim 17, wherein the method further includes the step of adjusting an optical parameter of an optical system used during the photolithographic pattern transfer process to substantially account for the estimated critical dimension variation.

26. The method of claim 17, wherein the method further includes the step of adjusting at least one of a mask dimension and another optical parameter of an optical system used during the photolithographic pattern transfer process to substantially account for the estimated critical dimension variation.

27. The method of claim 17, wherein the estimated critical dimension variation corresponds to at least one of an estimated line width variation and an estimated line length variation.

* * * * *